United States Patent
Suzuki

(10) Patent No.: US 8,263,235 B2
(45) Date of Patent: Sep. 11, 2012

(54) ORGANIC LIGHT EMITTING DEVICE HAVING A HIGH LIGHT EXTRACTION EFFICIENCY

(75) Inventor: Koichi Suzuki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1078 days.

(21) Appl. No.: 12/144,389

(22) Filed: Jun. 23, 2008

(65) Prior Publication Data

US 2009/0004507 A1    Jan. 1, 2009

(30) Foreign Application Priority Data

Jun. 26, 2007   (JP) .................. 2007-167194

(51) Int. Cl.
*B32B 9/04* (2006.01)

(52) U.S. Cl. ........ 428/690; 428/704; 438/478; 438/584; 438/758

(58) Field of Classification Search .................. 428/704, 428/690

See application file for complete search history.

(56) References Cited

U.S. PATENT DOCUMENTS

| | | | | |
|---|---|---|---|---|
| 5,891,554 | A | 4/1999 | Hosokawa et al. | 428/212 |
| 6,124,024 | A | 9/2000 | Hosokawa et al. | 428/212 |
| 6,762,553 | B1 | 7/2004 | Yokogawa et al. | 313/509 |
| 6,768,132 | B2 * | 7/2004 | Smith et al. | 257/40 |
| 6,908,696 | B2 | 6/2005 | Imamura et al. | 428/690 |
| 7,034,454 | B2 | 4/2006 | Kawai et al. | 313/504 |
| 7,309,533 | B2 | 12/2007 | Saitoh et al. | 428/690 |
| 7,991,257 | B1 * | 8/2011 | Coleman | 385/129 |
| 2005/0048313 | A1 * | 3/2005 | Sotoyama | 428/690 |
| 2005/0225232 | A1 * | 10/2005 | Boroson et al. | 313/504 |
| 2006/0017376 | A1 | 1/2006 | Okinaka et al. | 313/504 |
| 2006/0102913 | A1 * | 5/2006 | Park | 257/89 |
| 2006/0163562 | A1 * | 7/2006 | Boerner | 257/40 |
| 2010/0320446 | A1 * | 12/2010 | Kang et al. | 257/40 |

FOREIGN PATENT DOCUMENTS

| | | |
|---|---|---|
| JP | 07-240277 | 9/1995 |
| JP | 2001-202827 | 7/2001 |
| JP | 2002-056980 | 2/2002 |
| JP | 2003-272841 | 9/2003 |

OTHER PUBLICATIONS

Arentoft et al., "Second-harmonic Imaging of Poled Silica Waveguides," *Appl. Phys. Ltrs.*, vol. 76, No. 1, 25-27 (2000).

* cited by examiner

*Primary Examiner* — Michael Kornakov
*Assistant Examiner* — Kenneth A Bratland, Jr.
(74) *Attorney, Agent, or Firm* — Fitzpatrick, Cella, Harper & Scinto

(57) ABSTRACT

An organic light emitting device having a high light extraction efficiency and being excellent in an light emitting efficiency and durability is provided. The organic light emitting device includes an anode and a cathode, and a layer formed of an organic compound interposed between the anode and the cathode. The layer formed of the organic compound includes a light emitting layer, and the light emitting layer is formed of at least one organic light emitting material and an aliphatic compound, and a refractive index of the light emitting layer is 1.40 or more to 1.60 or less.

6 Claims, 6 Drawing Sheets

ORGANIC LIGHT EMITTING DEVICE HAVING A HIGH LIGHT EXTRACTION EFFICIENCY

BACKGROUND OF THE INVENTION

1. Field of the Invention

The present invention relates to an organic light emitting device.

2. Description of the Related Art

In order to enhance performance capabilities of an organic light emitting device, such as an light emitting efficiency and a life thereof, a number of materials and devices have been developed.

On the other hand, researches for enhancing a light extraction efficiency at which light is extracted outside of an organic light emitting device, and enhancing the performance capabilities such as an light emitting efficiency and a life have also been conducted. For example, it has been reported that a light extraction efficiency is enhanced by providing a layer having a low refractive index formed of silica aerogel or the like in an organic light emitting device (Japanese Patent Application Laid-Open No. 2001-202827).

A light extraction efficiency η at which light generated inside an organic light emitting device is extracted outside thereof depends upon a critical angle θ of a total reflection angle when light is output from a medium having a refractive index of n to the air having a refractive index of 1.00. The critical angle θ is given by the following Expression (1) according to the law of refraction.

$$\theta = \sin^{-1}(1/n) \qquad (1)$$

According to the above expression, among the light emitted in the medium having a refractive index of n, only light in an escape cone having an output angle of θ or less can be extracted outside of the organic light emitting device.

Further, the light extraction efficiency η can be given by the following Expression (2).

$$H = 1 - \cos\theta \approx 1/2n^2 \qquad (2)$$

In the organic light emitting device illustrated in FIG. 1, light reflection on a side opposite to a light extraction plane does not need to be considered because of the plate structure of a light emitting layer 3, so an output angle θ is determined only by a refractive index n of the light emitting layer 3, and is not influenced at all by the layer structure placed therebetween. Further, it has also been shown that the light extraction efficiency η increases quadratically if the refractive index n of the light emitting layer 3 is small according to Expression (2) (Appl. Phys. Lett., 76, 27 (2000)).

The light emitting layer using an organic light emitting material has a refractive index in a range of 1.7 to 1.8. For example, it is known that $Alq_3$ which is a typical light emitting material has a refractive index of 1.70 (Japanese Patent Application Laid-Open No. H07-240277). In the case where $Alq_3$ is used alone in the light emitting layer, the light extraction efficiency η is determined to be about 17.3% when 1.70 is substituted for n in Expression (2).

As described above, although the light extraction efficiency of an organic light emitting device is determined by the refractive index of a light emitting layer, it has not been reported that the light extraction efficiency of the organic light emitting device is enhanced actually when the refractive index of the light emitting layer is decreased.

On the other hand, an attempt to include a compound containing fluorine in a light emitting layer has been made. For example, it is known that a fluorinated leveling agent is included in a light emitting layer (Japanese Patent Application Laid-Open No. 2002-56980), and a fluorinated surfactant is included in a light emitting layer (Japanese Patent Application Laid-Open No. 2003-272841). It should be noted that the objects thereof are to enhance the flatness of a light emitting layer, suppress coating unevenness, and the like.

SUMMARY OF THE INVENTION

The object of the present invention is to provide an organic light emitting device having a high light extraction efficiency and being excellent in an light emitting efficiency and durability. Another object of the present invention is to provide an organic light emitting device that can be produced easily by a relatively inexpensive coating method.

The inventor of the present invention have found that a high light extraction efficiency and excellent initial characteristics and durability can be obtained by decreasing the refractive index of a light emitting layer of an organic light emitting device.

That is, an organic light emitting device of the present invention includes an anode, a cathode, and a layer formed of an organic compound interposed between the anode and the cathode. The layer formed of the organic compound includes a light emitting layer, and the light emitting layer is formed of at least one organic light emitting material and an aliphatic compound, and a refractive index of the light emitting layer is 1.40 or more to 1.60 or less.

The present invention can provide an organic light emitting device having a high light extraction efficiency and being excellent in an light emitting efficiency and durability.

Further features of the present invention will become apparent from the following description of exemplary embodiments with reference to the attached drawings.

DESCRIPTION OF THE EMBODIMENTS

Figure 1:
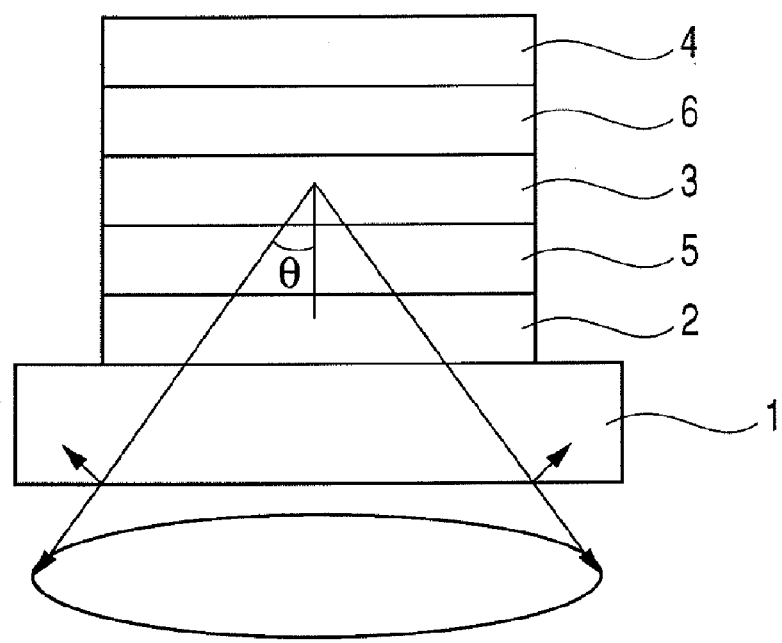
FIG. 1 is a view illustrating a relationship between a critical angle θ of a total reflection angle in an organic light emitting device and light extraction to the outside of the device.

Hereinafter, the present invention will be described in detail. An organic light emitting device of the present invention includes an anode, a cathode, and a layer formed of an organic compound interposed between the anode and the cathode. The layer formed of an organic compound includes a light emitting layer.

Hereinafter, the organic light emitting device of the present invention will be described in detail with reference to figures.

First, reference numerals used in the figures will be described. Reference numeral 1 denotes a substrate; 2, an anode; 3, a light emitting layer; 4, a cathode; 5 a hole transporting layer; 6, an electron transporting layer; 7, a hole injecting layer; 9, a hole/exciton blocking layer; and 10, 20, 30, 40, 50, 60 and 70, an organic light emitting device, respectively.

Figure 2:
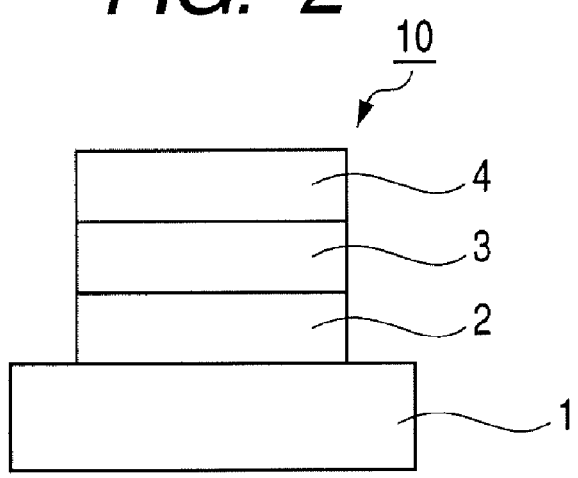
FIG. 2 is a cross-sectional view illustrating a first embodiment in an organic light emitting device of the present invention.

FIG. 2 is a cross-sectional view illustrating a first embodiment in the organic light emitting device of the present invention. The organic light emitting device 10 illustrated in FIG. 2 is obtained by sequentially providing the anode 2, the light emitting layer 3, and the cathode 4 on the substrate 1. The organic light emitting device 10 illustrated in FIG. 2 is useful when the light emitting layer 3 is formed of an organic compound having all of a hole transporting ability, an electron transporting ability, and light emitting property. In addition, the device is useful also when the light emitting layer 3 is formed by mixing organic compounds each having any one of the hole transporting ability, the electron transporting ability, and the light emitting property.

Figure 3:
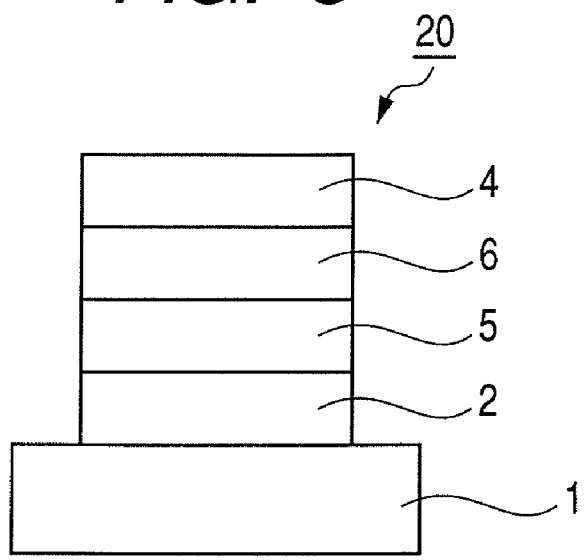
FIG. 3 is a cross-sectional view illustrating a second embodiment in the organic light emitting device of the present invention.

FIG. 3 is a cross-sectional view illustrating a second embodiment in the organic light emitting device of the present invention. The organic light emitting device 20 illustrated in FIG. 3 is sequentially provided with the anode 2, the hole transporting layer 5, the electron transporting layer 6, and the cathode 4 on the substrate 1. The organic light emitting device 20 illustrated in FIG. 3 is useful when the device is used in combination with a light emitting organic compound having one of hole transporting ability and electron transporting ability and an organic compound having a mere electron transporting ability or a mere hole transporting ability. In addition, in the light emitting device illustrated in FIG. 3, the hole transporting layer 5 or the electron transporting layer 6 also works as a light emitting layer.

Figure 4:
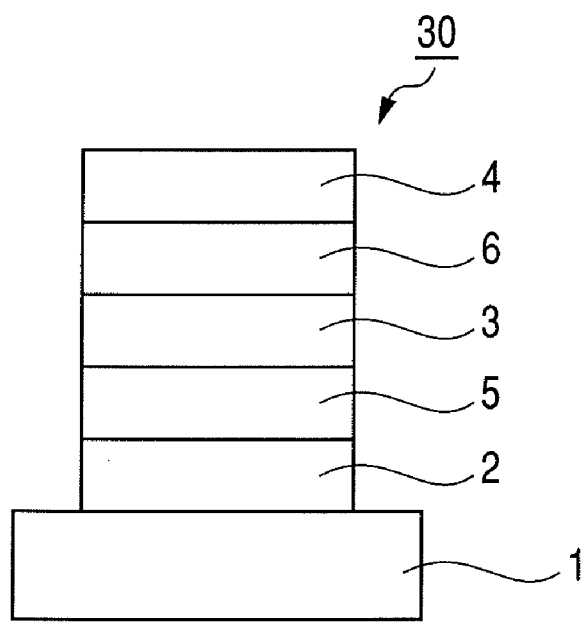
FIG. 4 is a cross-sectional view illustrating a third embodiment in the organic light emitting device of the present invention.

FIG. 4 is a cross-sectional view illustrating a third embodiment in the organic light emitting device of the present invention. The organic light emitting device 30 illustrated in FIG. 4 is the device in which the light emitting layer 3 was inserted between the hole transporting layer 5 and the electron transporting layer 6 in the organic light emitting device 20 illustrated in FIG. 3. A carrier transporting function and a light emitting function are separated in the organic light emitting device 30 illustrated in FIG. 4. The light emitting device 30 illustrated in FIG. 4 may use an appropriate combination of organic compounds each having any one of a hole transporting ability, an electron transporting ability, and light emitting property. Therefore, the degree of freedom in selection of a material extremely increases, and various organic compounds having different light emission wavelengths can be used. As a result, the range of light emission hue can be widened. Further, a light emitting efficiency of the organic light emitting device 30 illustrated in FIG. 4 can also be improved by effectively confining each carrier or exciton in the central light emitting layer 3.

Figure 5:
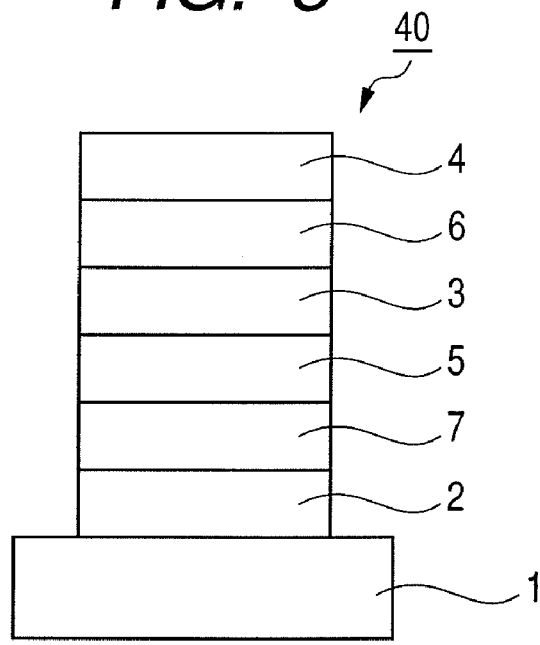
FIG. 5 is a cross-sectional view illustrating a fourth embodiment in the organic light emitting device of the present invention.

FIG. 5 is a cross-sectional view illustrating a fourth embodiment in the organic light emitting device of the present invention. The organic light emitting device 40 illustrated in FIG. 5 is different from the organic light emitting device 30 illustrated in FIG. 4 in that the hole injecting layer 7 is provided between the anode 2 and the hole transporting layer 5. The organic light emitting device 40 illustrated in FIG. 5 is effective in reducing the voltage at which the device is driven because adhesiveness between the anode 2 and the hole transporting layer 5 or hole injecting property is improved by providing the hole injecting layer 7.

Figure 6:
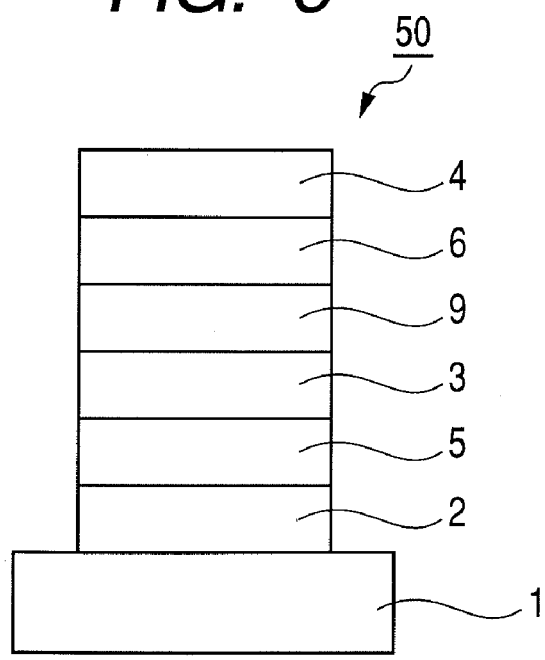
FIG. 6 is a cross-sectional view illustrating a fifth embodiment in the organic light emitting device of the present invention.

FIG. 6 is a cross-sectional view illustrating a fifth embodiment of the organic light emitting device of the present invention. The organic light emitting device illustrated 50 in FIG. 6 has a configuration in which a hole/exciton blocking layer 9 is provided between the light emitting layer 3 and the electron transporting layer 6 in the organic light emitting device 30 illustrated in FIG. 4. In the organic light emitting device 50 illustrated in FIG. 6, holes or exitons are suppressed from being output from the light emitting layer 3 to the cathode 4 due to the presence of the hole/exciton blocking layer 9, so the organic light emitting device 50 illustrated in FIG. 6 is effective for enhancing the light emitting efficiency.

Figure 7:
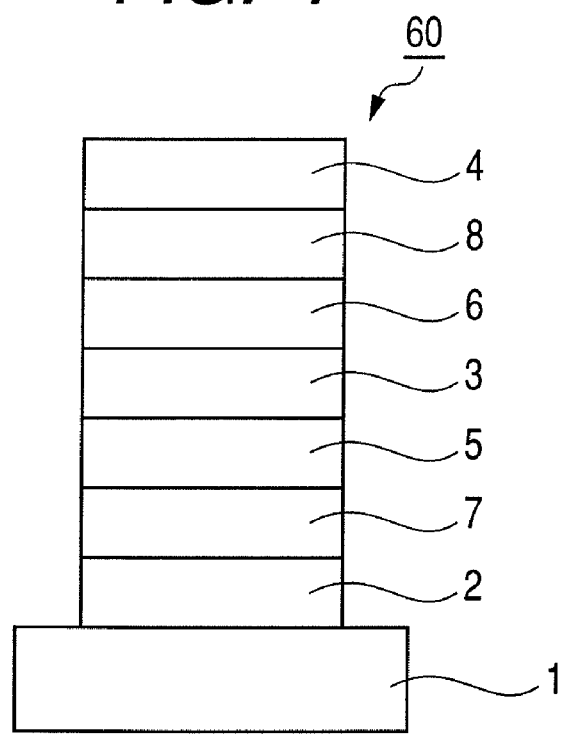
FIG. 7 is a cross-sectional view illustrating a sixth embodiment in the organic light emitting device of the present invention.

FIG. 7 is a cross-sectional view illustrating a sixth embodiment of the organic light emitting device of the present invention. The organic light emitting device 60 in FIG. 7 has a configuration in which the electron injecting layer 8 is provided between the electron transporting layer 6 and the cathode 4 in the organic light emitting device 40 illustrated in FIG. 5. The organic light emitting device 60 illustrated in FIG. 7 is effective for reducing a voltage due to the presence of the electron injecting layer 8 between the electron transporting layer 6 and the cathode 4.

Figure 8:
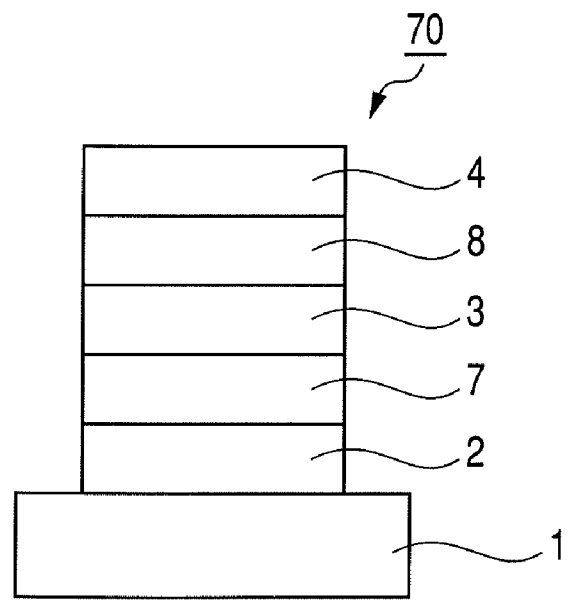
FIG. 8 is a cross-sectional view illustrating a seventh embodiment in the organic light emitting device of the present invention.

FIG. 8 is a cross-sectional view illustrating a seventh embodiment of the organic light emitting device 70 of the present invention. In the organic light emitting device 70 illustrated in FIG. 8, the anode 2, the hole injecting layer 7, the light emitting layer 3, the electron injecting layer 8, and the cathode 4 are successively provided on the substrate 1.

The organic light emitting devices illustrated in FIGS. 2 to 8 have basic device configurations, and the configuration of the organic light emitting device of the present invention is not limited thereto. For example, the organic light emitting device of the present invention can have various layer configurations in which an insulating layer, an adhesive layer, or an interference layer is provided on an interface between the electrode and the layer formed of an organic compound, the hole injecting layer or the hole transporting layer is composed of two layers having different ionization potentials, etc.

The light emitting layer of the organic light emitting device of the present invention is composed of at least one organic light emitting material and an aliphatic compound.

The organic light emitting material constituting the light emitting layer of the organic light emitting device of the present invention is a fluorescent light emitting material or phosphorescent light emitting material.

Examples of the fluorescent light emitting material include condensed polycyclic compounds such as rubrene and coronene, heterocyclic compounds such as coumarin 6 and quinacrine, and a complex such as $Alq_3$.

Examples of the phosphorescent light emitting material include complexes containing heavy metal such as an indium complex, an europium complex, and platinum porphyrin.

Next, specific examples of an aliphatic compound constituting the light emitting layer of the organic light emitting device of the present invention will be described. Here, the aliphatic compound includes those in which fluorine atoms are substituted for a part or an entirety of hydrogen atoms in molecules (fluorine-containing aliphatic compound) and those in which molecules do not contain fluorine atoms (non-fluorine based aliphatic compound).

The aliphatic compound does not have an aromatic ring such as a benzene ring. Further, the aliphatic compound is a medium that functions as an insulator, and that holds an organic light emitting material uniformly in the light emitting layer. Here, carriers injected from each electrode reach the organic light emitting material due to the tunnel effects.

Here, as the fluorine-containing aliphatic compound, there are given a fluorine-containing acrylate polymer and a fluorine-containing vinyl polymer, and the like. Specific examples of the fluorine-containing aliphatic compound include poly(undecafluorohexyl acrylate) (n=1.356), poly(nonafluoropentyl acrylate), (n=1.360), poly(pentafluorovinyl propionate) (n=1.364), poly(heptafluorobutyl acrylate) (n=1.367), poly(trifluorovinyl acetate) (n=1.375), poly(octafluoropentyl acrylate) (n=1.380), poly(pentafluoropropyl acrylate) (n=1.385), poly(2,2,3,4,4,4-hexafluorobutyl acrylate) (n=1.392), poly(trifluoroethyl acrylate) (n=1.407), poly(trifluorochloroethylene) (n=1.419), and poly(trifluoroethyl methacrylate) (n=1.437).

As a non-fluorinated aliphatic compound, there are given an oxyalkylene polymer, a vinyl alkyl ether polymer, and the like. Specific examples of the aliphatic compound include poly(oxypropylene) (n=1.450), poly(vinyl isobutyl ether) (n=1.451), poly(vinyl ethyl ether) (n=1.454), poly(oxyethylene) (n=1.456), poly(vinyl pentyl ether) (n=1.458), poly(vinyl octyl ether) (n=1.461), poly(vinyl decyl ether) (n=1.463), poly(vinyl dodecyl ether) (n=1.464), poly(oxy-1-oxopentamethylene) (n=1.465), poly(vinyl propionate) (n=1.467), and poly(vinyl methyl ether) (n=1.467).

The light emitting layer of the organic light emitting device of the present invention has a refractive index of 1.40 or more to 1.60 or less.

Hereinafter, the factors determining the refractive index will be described.

A number of expressions relating the refractive index n to the chemical structure have been proposed. In the case of considering the relationship based on a structural point of view, preferably, the Lorentz-Lorenz formula represented by the following Expression (3) is used.

$$n=[(2\Phi+1)/(1-\Phi)]^{1/2} \quad (3)$$

In Expression (3), n represents a refractive index, and $\Phi$ represents a molecular refraction per molecular volume represented by the following Expression (4).

$$\Phi \approx 4/3\pi N\alpha (\approx R/V) \quad (4)$$

In Expression (4), N represents a molecular number in a unit volume, $\alpha$ represents a polarizability, R represents a molecular refraction, and V represents a molecular volume represented by the following Expression (5).

$$V=m/\rho \quad (5)$$

In Expression (4), M represents a molecular weight, and $\rho$ represents a density.

It is understood from Expression (3) that the refractive index n depends upon the molecular refraction $\Phi$ per molecular volume, and n decreases with the decrease in $\Phi$.

Further, it is understood from Expressions (4) and (5) that the molecular refraction $\Phi$ per molecular volume depends upon the molecular number N in a unit volume and the polarizability $\alpha$, and in the case where N is small (a density is low) or $\alpha$ is small (a polarizability is small), $\Phi$ becomes small.

In the organic light emitting device of the present invention, the refractive index of the light emitting layer is 1.40 or more to 1.60 or less. The refractive index is lower compared with the refractive index (about 1.7) of the light emitting layer formed of a known organic light emitting material. The refractive index of the light emitting layer can be decreased by including an organic material having a low polarizability (e.g., the above aliphatic compound) in the light emitting layer.

However, when the refractive index of the light emitting layer is set to be less than 1.4, it is necessary to use a fluorine-containing aliphatic compound having low solubility with respect to a solvent, which makes it difficult to form a light emitting layer. Further, when the refractive index of the light emitting layer is set to be 1.60 or more, the effects of enhancing a light extraction efficiency cannot be obtained sufficiently.

Examples of the fluorine-containing aliphatic compound include the above fluorine-containing acrylic polymer and a fluorine-containing vinyl polymer. It should be noted that a fluorine-containing aliphatic compound having a refractive index of less than 1.35 is not suitable as a material constituting a light emitting layer due to the low solubility with respect to a solvent. Further, with the fluorine-based aliphatic compound having a refractive index exceeding 1.47, the effects of enhancing a light extraction efficiency cannot be obtained sufficiently. For the above reasons, the fluorine-containing aliphatic compound used as a material constituting a light emitting layer is preferably selected from those having a refractive index of 1.35 or more to 1.47 or less.

Examples of the non-fluorine based aliphatic compound include the above oxyalkylene polymer and vinyl alkyl ether polymer. Regarding the non-fluorine based aliphatic compound having a refractive index of less than 1.43, the kind of a material is limited. Further, with the non-fluorine based aliphatic compound having a refractive index exceeding 1.47, the effects of enhancing a light extraction efficiency cannot be obtained. For the above reasons, the non-fluorine based aliphatic compound used as a material constituting a light emitting layer is preferably selected from those having a refractive index of 1.43 or more to 1.47 or less.

The amount of the organic light emitting material constituting the light emitting layer is preferably 2 parts by weight or more to 150 parts by weight or less based on 100 parts by weight of the aliphatic compound. In the case where the amount of the organic light emitting material is less than 2 parts by weight, a current does not flow sufficiently, with the result that sufficient light emission cannot be obtained.

Further, the refractive index of the light emitting layer is determined by the refractive indices and the mixing ratio of materials. That is, in a light emitting layer formed of an organic light emitting material having a refractive index of 1.7 and an aliphatic compound having a refractive index of less than 1.47, as the contents of the organic light emitting materials increase, the refractive index of the light emitting layer increases accordingly. Thus, in the case where the amount of the organic light emitting material is larger than 150 parts by weight, the refractive index of the light emitting layer increases, with the result that the effects of enhancing a light extraction efficiency cannot be obtained sufficiently.

The organic light emitting device of the present invention can use known hole transporting compound, light emitting compound, electron transporting compound, and the like in combination. Hereinafter, exemplary compounds will be illustrated.
Hole Transporting Compound
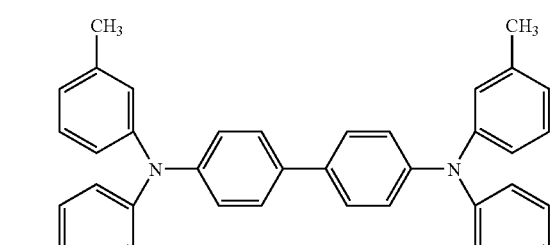
TPD
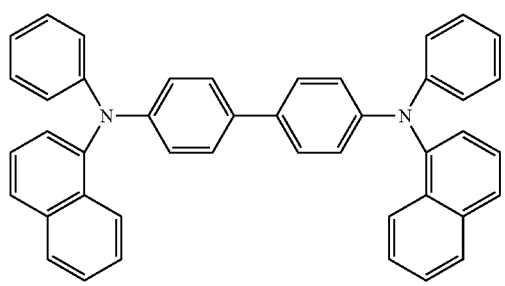
α-NPD
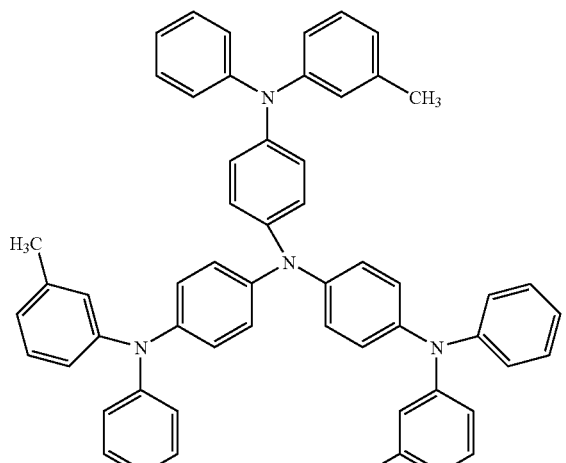
m-MTDATA
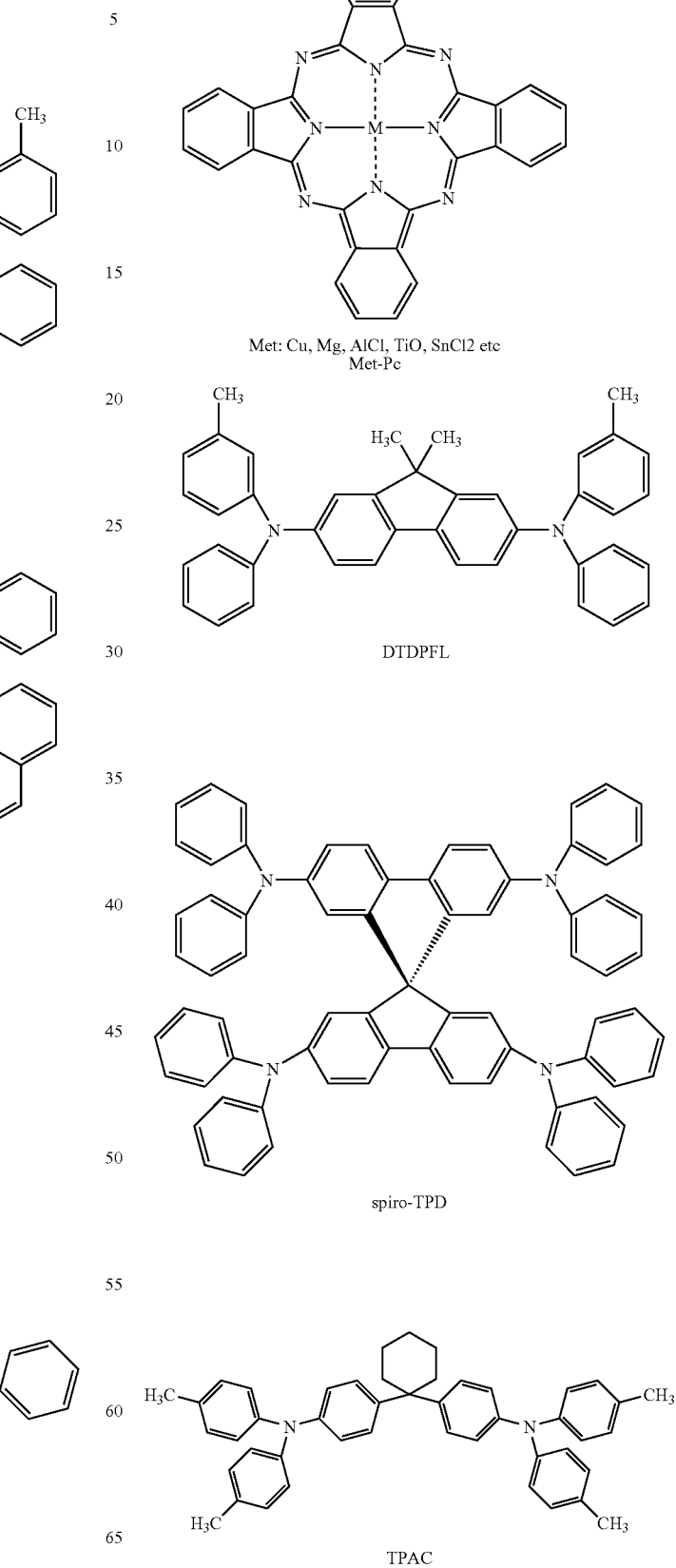
-continued
Met: Cu, Mg, AlCl, TiO, SnCl2 etc
Met-Pc
DTDPFL
spiro-TPD
TPAC

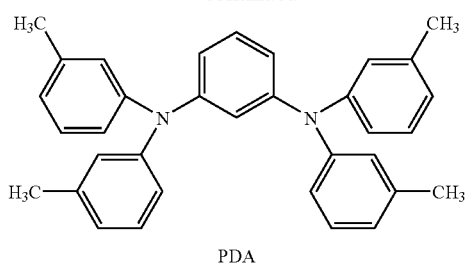
PDA
Light Emitting Compound, Electron Transporting Compound
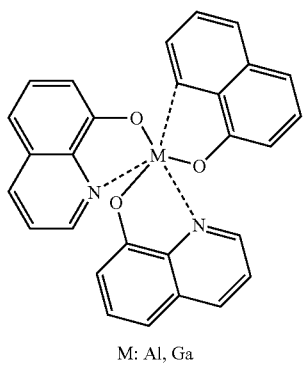
M: Al, Ga
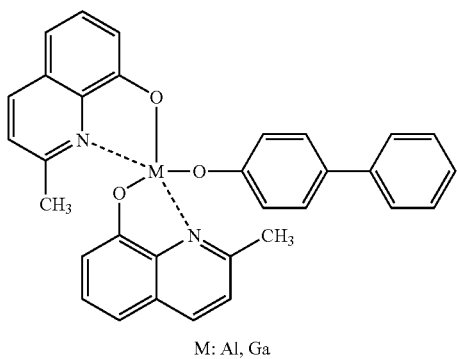
M: Al, Ga
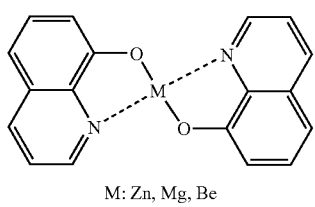
M: Zn, Mg, Be
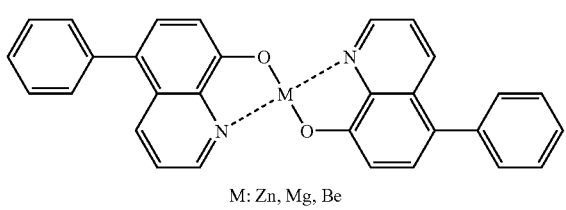
M: Zn, Mg, Be
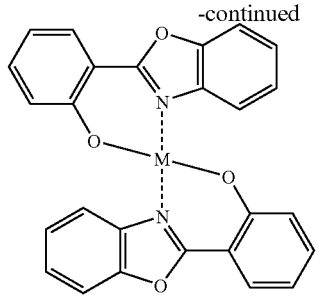
M: Zn, Mg, Be
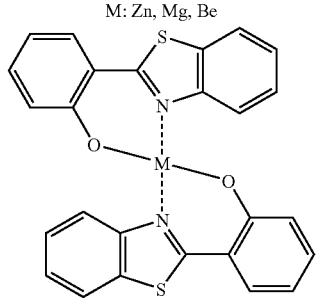
M: Zn, Mg, Be
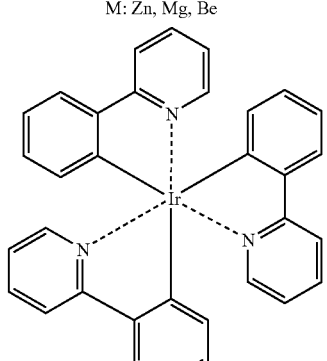
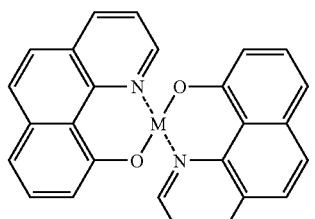
M: Zn, Mg, Be
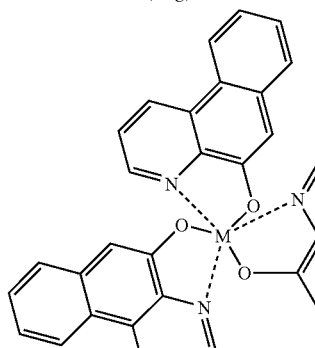
M: Al, Ga Light Emitting Compound
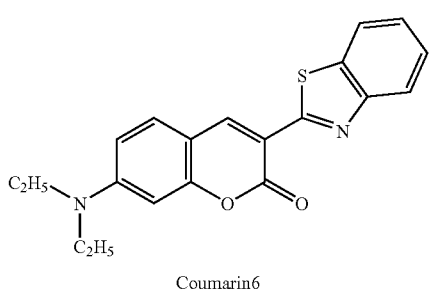
Coumarin6
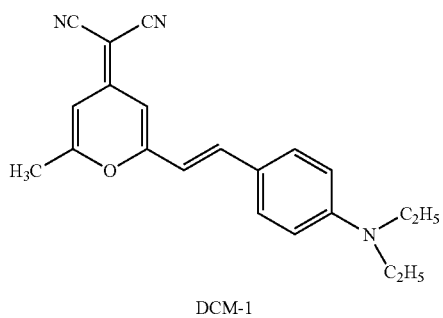
DCM-1
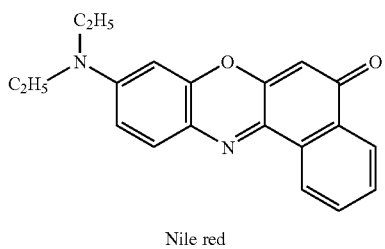
Nile red
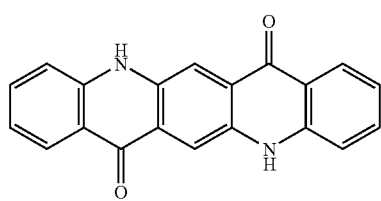
Quinacridone
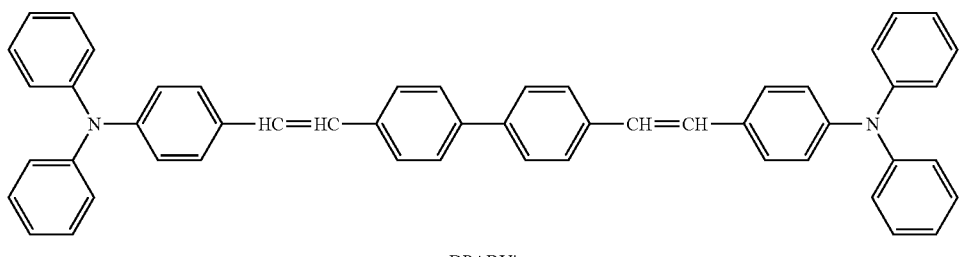
DPABVi
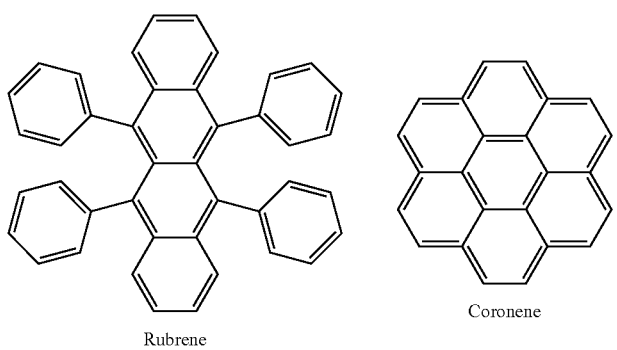
Rubrene
Coronene
Electron Transporting Compound
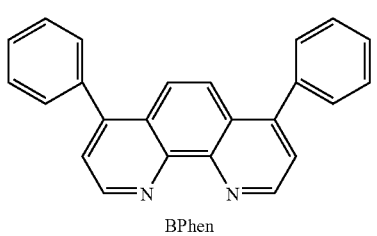
BPhen
-continued
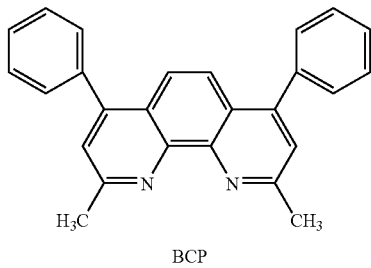
BCP -continued
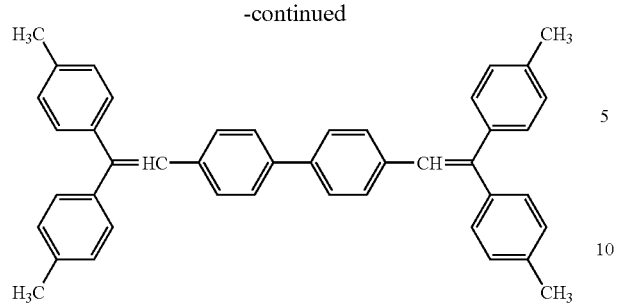
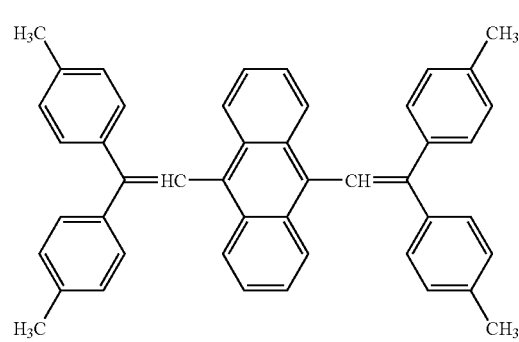
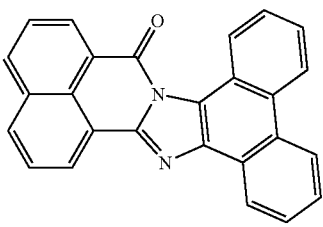
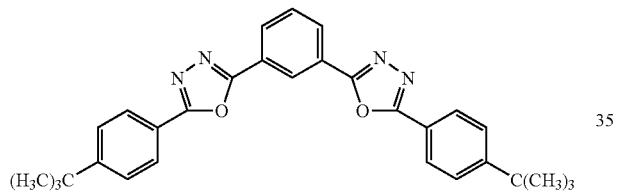
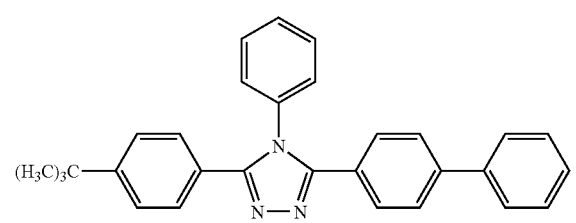
-continued
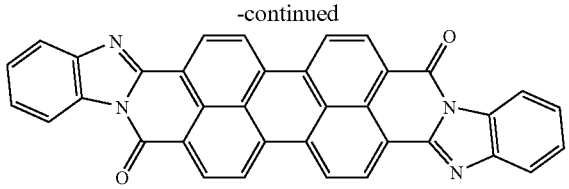
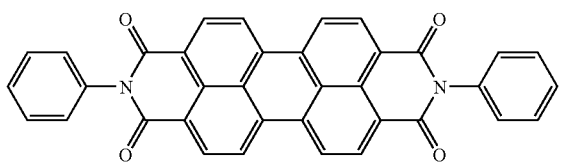
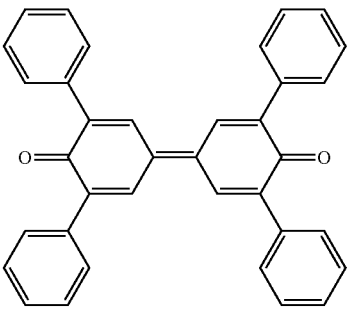
Polymer-Based Hole Transporting Compound
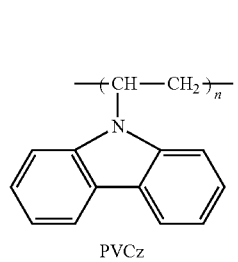
PVCz
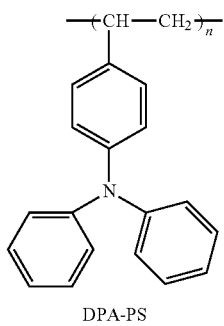
DPA-PS
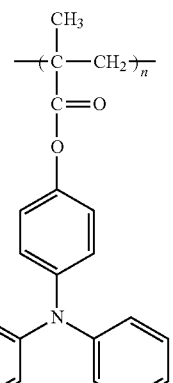
TPA-PMMA -continued
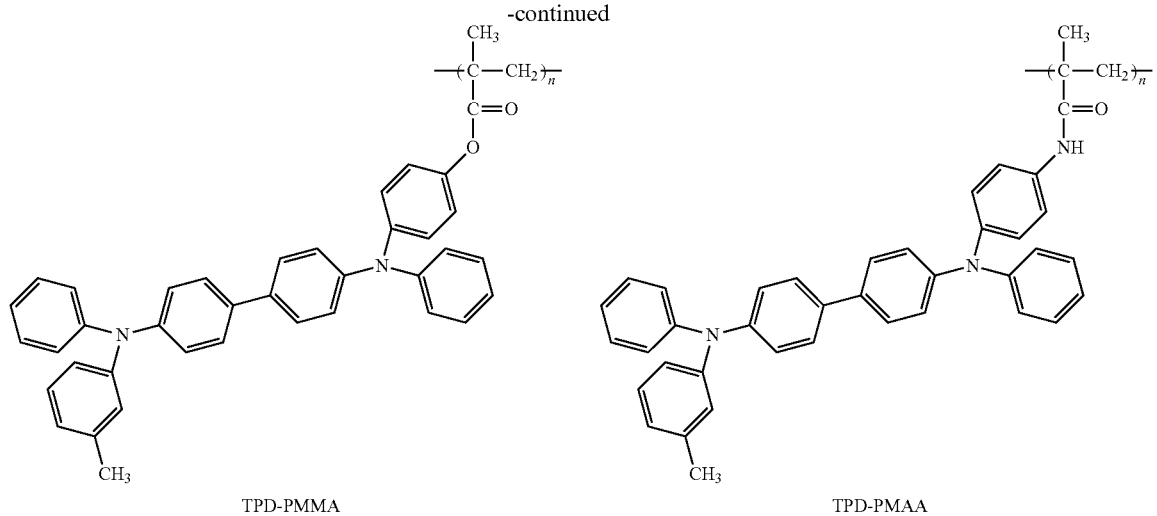
TPD-PMMA
TPD-PMAA
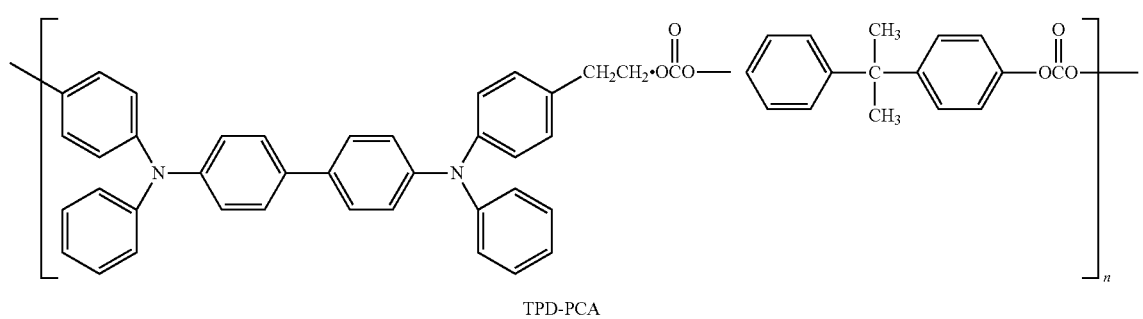
TPD-PCA
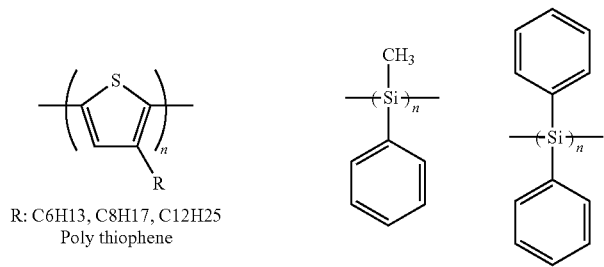
R: C6H13, C8H17, C12H25
Poly thiophene
Poly silicone
Polymer-Based Light Emitting Compound
-continued
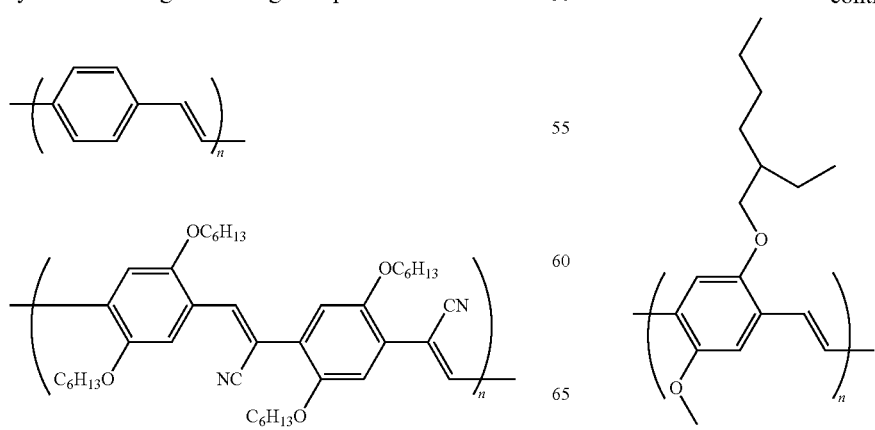

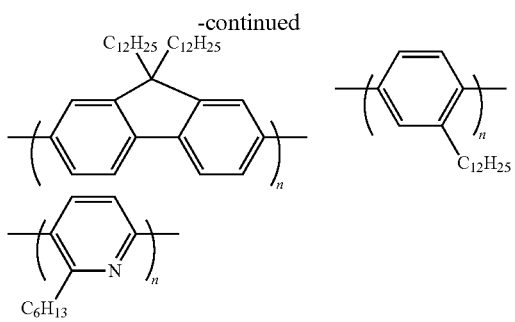

An anode material used in the organic light emitting device of the present invention preferably has as large a work function as possible. Examples of the anode material that can be used include: metal elements such as gold, silver, platinum, nickel, palladium, cobalt, selenium, and vanadium, and alloys thereof obtained by combining the multiple metal elements; and metal oxides such as tin oxide, zinc oxide, indium tin oxide (ITO), and indium zinc oxide. A conductive polymer such as polyaniline, polypyrrole, polythiophene, and polyphenylene sulfide can also be used. Each of those electrode substances may be used alone, or a plurality of the substances may be used in combination.

On the other hand, the cathode material preferably has as small a work function as possible. Examples of the cathode material that can be used include metal elements such as lithium, sodium, potassium, cesium, calcium, magnesium, aluminum, indium, silver, lead, tin, and chromium, alloys obtained by combining the multiple metal elements, and salts of those metal elements. A metal oxide such as indium tin oxide (ITO) can also be used. In addition, a cathode may have a single layer constitution or a multilayer constitution.

A substrate to be used in the organic light emitting device of the present invention is not particularly limited; provided that an opaque substrate such as a metallic substrate or a ceramic substrate, or a transparent substrate such as glass, quartz, or a plastic sheet is used. In addition, a luminescent color can also be controlled by using a color filter film, a fluorescent color conversion filter film, a dielectric reflective film, or the like as the substrate.

The produced device may be provided with a protective layer or a sealing layer for the purpose of preventing the device from contacting with oxygen, moisture, or the like. Examples of the protective layer include: inorganic material films such as a diamond thin film, a metal oxide, and a metal nitride; polymer films such as a fluorine resin, polyparaxylene, polyethylene, a silicone resin, and a polystyrene resin; and a photocurable resin. In addition, the device itself can be covered with glass, a gas impervious film, metal, or the like, and can be packaged with an appropriate sealing resin.

It is preferred that the light emitting layer of the present invention is produced by a solution coating method. Examples of the coating method include spin coating, dispensing, printing, slit coating, an ink jet method, and spraying. The thickness of the light emitting layer is determined in view of the emission start voltage and the application voltage of the organic light emitting device, and is less than 10 μm, preferably 1 μm or less, and more preferably 30 nm or more to 500 nm or less.

The organic light emitting device of the present invention may have a plurality of organic layers in addition to the light emitting layer, and examples of the organic layers include a hole injecting layer, a hole transporting layer, a hole/exciton blocking layer, an electron transporting layer, and an electron injecting layer. These layers are produced by vapor deposition or solution coating, and the thickness thereof is less than 5 μm, preferably 1 μm or less, and more preferably 10 nm or more to 500 nm or less.

Next, the display apparatus of the present invention will be described.

Figure 9:
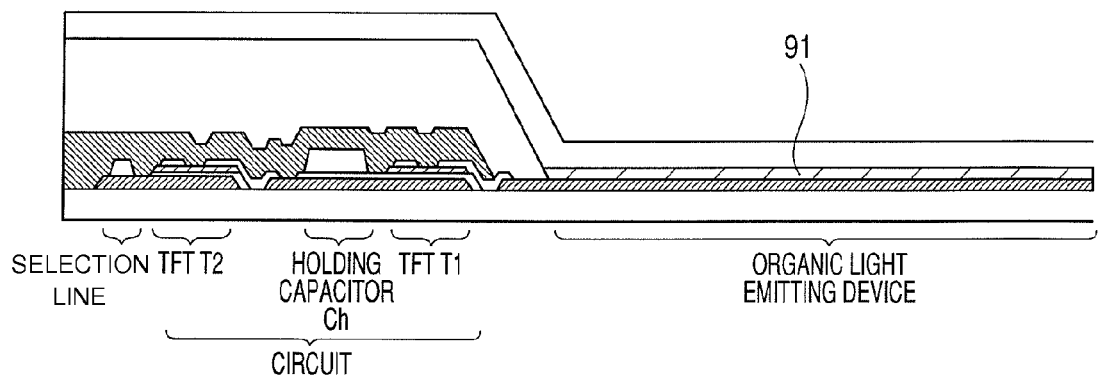
FIG. 9 is a schematic cross-sectional view illustrating an organic light emitting device according to an embodiment of the present invention and a circuit and wiring for driving the device.
Figure 11:
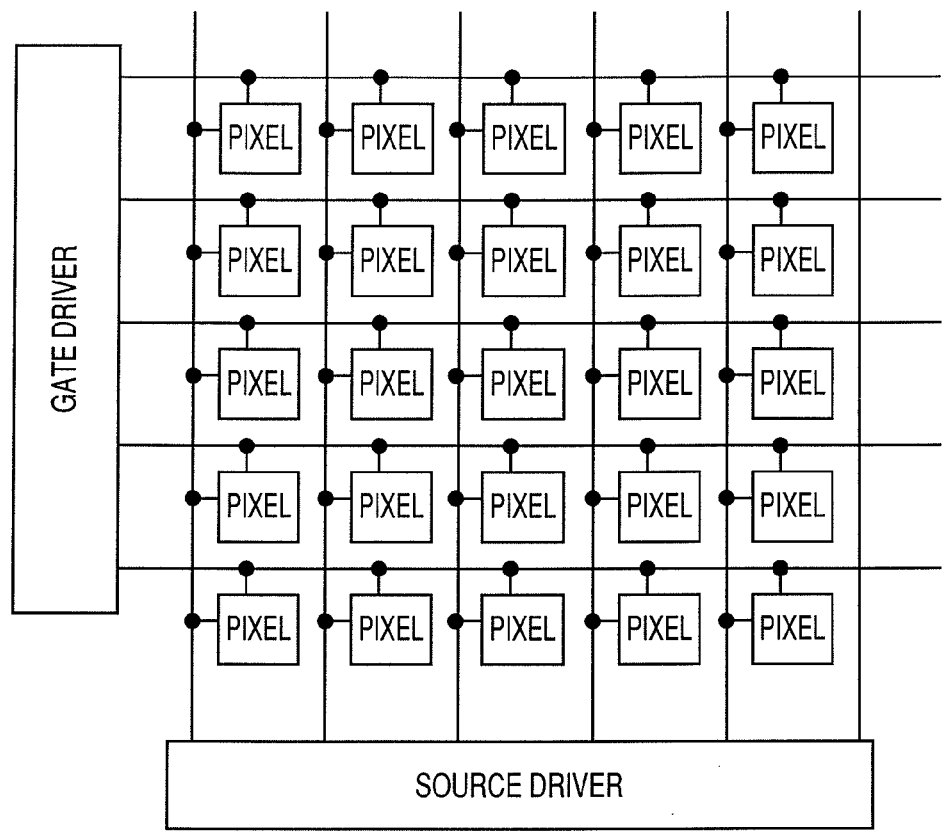
FIG. 11 is a schematic view illustrating the state of a display in which the organic EL device and the circuit illustrated in FIGS. 9 and 10 are arranged in a matrix with each organic EL device and circuit being one pixel.

FIG. 9 is a schematic cross-sectional view illustrating the arrangement of an organic light emitting device on a substrate, a circuit placed outside thereof, and a data wiring. The circuit is composed of TFTs, a holding capacitor, and the like. The organic light emitting device includes an anode, a cathode, and an organic compound layer 91 placed between the anode and the cathode. The organic light emitting device may have, for example, an auxiliary electrode in addition to the anode, the cathode, and the organic compound layer 91. In FIG. 9, although only a light emitting device 1 is illustrated, organic light emitting devices are placed two-dimensionally as illustrated in FIG. 11 described later, in the case of constituting a display apparatus.

Figure 10:
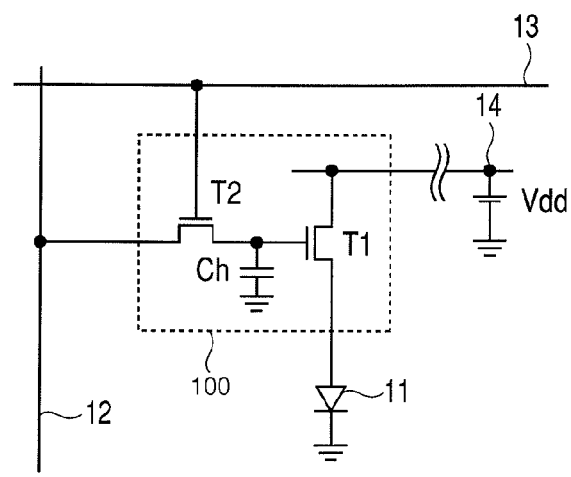
FIG. 10 is a diagram illustrating the detail of the circuit illustrated in FIG. 9.

FIG. 10 illustrates the detail of the configuration of the circuit illustrated in FIG. 9. The circuit has a typical circuit configuration called a current programming system. The circuit of the present invention is not limited thereto. A circuit 100 is composed of a drive transistor T1, a switching transistor T2, a holding capacitor Ch, and an organic light emitting device 11. This is a well-known circuit configuration, so the description of the detail of the operation thereof will be omitted. The organic light emitting device can be used as one light emitting point in an exposure light source of a display, an illumination apparatus, and an image forming apparatus of an electrophotographic system. In FIG. 10, reference numeral 12 denotes a data line, 13 denotes a selection line, and 14 denotes a power source line.

The case where the above organic light emitting device is used in a display will be described. FIG. 11 schematically illustrates the state in which the organic light emitting device and the circuit illustrated in FIGS. 9 and 10 provided as one pixel are arranged two-dimensionally in a plural number on an identical plane, i.e., the arrangement in a matrix. The pixels are connected to a gate driver and a source driver via wiring, and supplied with a driving pulse, whereby the pixels are placed in an emission state or a non-emission state. A region in which a plurality of such organic light emitting devices are placed as pixels in the identical plane in an in-plane direction corresponds to a display region. That is, the organic light emitting device of the present embodiment can be used in the display region.

The display may have any form, as long as it is a display apparatus for a television or a personal computer, or an appliance having a portion displaying an image. For example, the display may be a portable display apparatus. Alternatively, the display according to the present embodiment can be used in a display portion of an electron imaging apparatus such as a digital camera and a mobile telephone.

Figure 12:
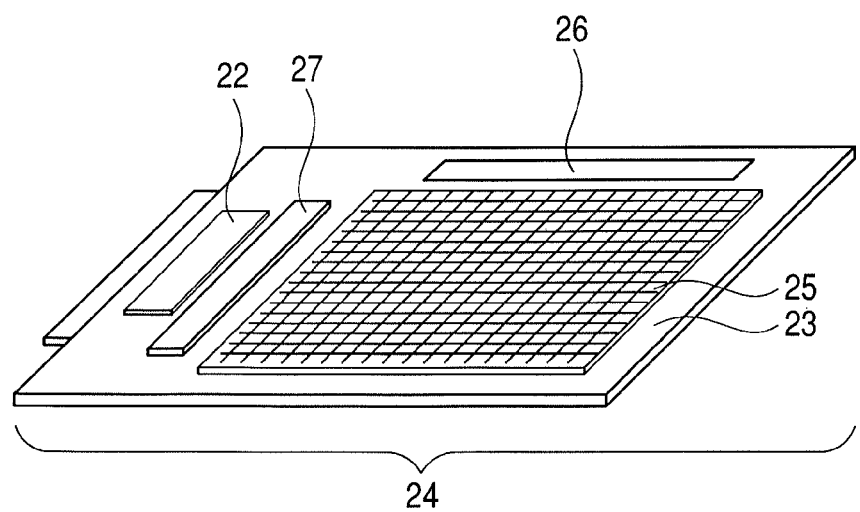
FIG. 12 is a schematic view illustrating a configuration in which the display illustrated in FIG. 11 is formed into a display apparatus.

FIG. 12 shows the configuration of a display apparatus formed of the display illustrated in FIG. 11. The display apparatus refers to a configuration in which components required for connection to external appliances such as an interface driver 22 and a connection terminal, and the display illustrated in FIG. 11 are integrated in a housing 23. In FIG. 11, reference numeral 24 denotes a panel module, 25 denotes a display region, 26 denotes a source deriver, and 27 denotes a gate driver.

Hereinafter, the present invention will be described more specifically by way of examples. It should be noted that the present invention is not limited thereto.

EXAMPLE 1

An organic light emitting device illustrated in FIG. 8 was produced as follows.

Indium tin oxide (ITO) was formed into a film on a glass substrate (substrate 1) by sputtering, whereby an anode 2 was formed. At this time, the thickness of the anode 2 was set to be 120 nm. Then, the substrate with the ITO formed thereon was washed with an ultrasonic wave successively with acetone and isopropyl alcohol (IPA), and washed by boiling with IPA, followed by drying. The substrate was further washed with UV/ozone. The substrate treated as described above was used as a transparent conductive support substrate.

Next, Baytron P A1-4083 (manufactured by H.C. Starck Inc.) was formed into a film on the transparent conductive support substrate by spin coating. At this time, the thickness of Bytron was set to be 50 nm. Next, the resultant film was heated at 100° C. for 30 minutes, whereby a hole injecting layer 7 was formed.

Next, 0.5 g of a fluorene compound represented by the following formula and 0.5 g of poly(octafluoropentyl acrylate) (n=1.38, molecular weight: 15,000) were dissolved in 50 g of 1,2-dichloropropane to prepare a mixed solution. The mixed solution was applied to the hole injecting layer 7 by spin coating, and heated at 100° C. for one hour, whereby a light emitting layer 3 was formed. At this time, the thickness of the light emitting layer 3 was set to be 100 nm.

(Fluorene Compound)

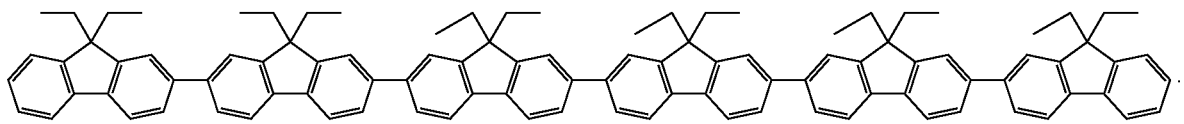

Next, calcium was vapor-deposited on the light emitting layer 3 by vacuum vapor deposition, whereby a metal layer film was formed as an electron injecting layer 8. At this time, the film thickness of the electron injecting layer 8 was set to be 1 nm, the vacuum degree during vapor deposition was set to be $1.0 \times 10^{-4}$ Pa, and the film forming rate was set to be 0.1 nm/sec.

Next, aluminum was vapor-deposited by vacuum vapor deposition, whereby a cathode 4 was formed. At this time, the film thickness of the cathode 4 was set to be 150 nm, the vacuum degree during vapor deposition was set to be $1.0 \times 10^{-4}$ Pa, and the film forming rate was set to be 1.0 nm/sec. to 1.2 nm/sec.

Next, a glass plate for protection was placed over the cathode 4 in a nitrogen atmosphere, and sealed with an acrylic resin based adhesive. Thus, an organic light emitting device was obtained.

When a DC voltage of 5 V was applied to the obtained organic light emitting device, with the ITO electrode (anode 2) being a positive electrode and the Al electrode (cathode 4) being a negative electrode, a current flowed through the device. The current density at this time was 20 mA/cm$^2$. Further, in the device, blue light emission with a luminance of 1,200 cd/m$^2$ was observed, the chromaticity of the EL light emission was (X, Y)=(0.14, 0.13), and the external quantum efficiency was 5.9%.

Further, when a voltage was applied for 100 hours while the current density was kept at 5.0 mA/cm$^2$, the luminance changed from 250 cd/M$^2$ (initial luminance) to 200 cd/m$^2$ (after 100 hours). It was found from the result that the degradation in luminance of the organic light emitting device of the present example was small.

On the other hand, the refractive index of the light emitting layer 3 was measured with a spectral ellipsometer (GES 500 manufactured by SOPRA), or the like. As a sample for refractive index measurement, a glass plate with a film formed thereon separately by the same method as that of the light emitting layer 3 was used. As a result of the measurement, the refractive index of the light emitting layer 3 was 1.51. Table 1 shows the results.

EXAMPLE 2

In Example 1, as a material constituting the light emitting layer 3, poly(nonafluoropentyl acrylate) (n=1.36, molecular weight: 12,000) was used in place of poly(octafluoropentyl acrylate) (n=1.38, molecular weight: 15,000). A device was produced by the same method as that of Example 1 except for the above. The obtained device was evaluated in the same way as in Example 1. Further, the refractive index of the light emitting layer 3 was evaluated in the same way as in Example 1. Table 1 shows the results.

EXAMPLE 3

In Example 1, as a material constituting the light emitting layer 3, poly(trifluoroethyl acrylate) (n =1.41, molecular weight: 20,000) was used in place of poly(octafluoropentyl acrylate) (n=1.38, molecular weight: 15,000). A device was produced by the same method as that of Example 1 except for the above. The obtained device was evaluated in the same way as in Example 1. Further, the refractive index of the light emitting layer 3 was evaluated in the same way as in Example 1. Table 1 shows the results.

EXAMPLE 4

In Example 1, as a material constituting the light emitting layer 3, poly(trifluoroethyl methacrylate) (n=1.44, molecular weight: 25,000) was used in place of poly(octafluoropentyl acrylate) (n=1.38, molecular weight: 15,000). A device was produced by the same method as that of Example 1 except for the above. The obtained device was evaluated in the same way as in Example 1. Further, the refractive index of the light emitting layer 3 was evaluated in the same way as in Example 1. Table 1 shows the results.

EXAMPLE 5

In Example 1, as a material constituting the light emitting layer 3, poly(oxypropylene) (n=1.45, molecular weight: 15,000) was used in place of poly(octafluoropentyl acrylate) (n=1.38, molecular weight: 15,000). A device was produced by the same method as that of Example 1 except for the above. The obtained device was evaluated in the same way as in Example 1. Further, the refractive index of the light emitting layer 3 was evaluated in the same way as in Example 1. Table 1 shows the results.

EXAMPLE 6

In Example 1, as a material constituting the light emitting layer 3, poly(vinyl isobutyl ether) (n=1.45, molecular weight:

25,000) was used in place of poly(octafluoropentyl acrylate) (n=1.38, molecular weight: 15,000). A device was produced by the same method as that of Example 1 except for the above. The obtained device was evaluated in the same way as in Example 1. Further, the refractive index of the light emitting layer 3 was evaluated in the same way as in Example 1. Table 1 shows the results.

EXAMPLE 7

In Example 1, as a material constituting the light emitting layer 3, poly(vinyl octyl ether) (n=1.46, molecular weight: 20,000) was used in place of poly(octafluoropentyl acrylate) (n=1.38, molecular weight: 15,000). A device was produced by the same method as that of Example 1 except for the above. The obtained device was evaluated in the same way as in Example 1. Further, the refractive index of the light emitting layer 3 was evaluated in the same way as in Example 1. Table 1 shows the results.

as in Example 1. Further, the refractive index of the light emitting layer 3 was evaluated in the same way as in Example 1. Table 1 shows the results.

COMPARATIVE EXAMPLE 2

In Example 1, as a material constituting the light emitting layer 3, polycarbonate Z200 (manufactured by MITSUBISHI GAS CHEMICAL COMPANY, INC.) was used in place of poly(octafluoropentyl acrylate) (n=1.38, molecular weight: 15,000). A device was produced by the same method as that of Example 1 except for the above. The obtained device was evaluated in the same way as in Example 1. Further, the refractive index of the light emitting layer 3 was evaluated in the same way as in Example 1. Table 1 shows the results.

TABLE 1

|  | Refractive index of polymer | Refractive index of light emitting layer | Initial luminance @5 v application (current density) | External quantum efficiency (%) | Change in luminance (initial luminance → after 100 hours) @5 mA/m$^2$ |
|---|---|---|---|---|---|
| Example 1 | 1.38 | 1.51 | 1200 cd/m$^2$ (20 mA/m$^2$) | 5.9 | 250 → 200 cd/m$^2$ |
| Example 2 | 1.36 | 1.48 | 1100 cd/m$^2$ (18 mA/m$^2$) | 6.3 | 240 → 200 cd/m$^2$ |
| Example 3 | 1.41 | 1.54 | 1200 cd/m$^2$ (22 mA/m$^2$) | 5.2 | 220 → 180 cd/m$^2$ |
| Example 4 | 1.44 | 1.56 | 1000 cd/m$^2$ (18 mA/m$^2$) | 4.8 | 210 → 150 cd/m$^2$ |
| Example 5 | 1.45 | 1.57 | 1200 cd/m$^2$ (24 mA/m$^2$) | 4.7 | 200 → 170 cd/m$^2$ |
| Example 6 | 1.45 | 1.57 | 1200 cd/m$^2$ (24 mA/m$^2$) | 4.7 | 220 → 180 cd/m$^2$ |
| Example 7 | 1.46 | 1.58 | 1000 cd/m$^2$ (22 mA/m$^2$) | 4.6 | 200 → 160 cd/m$^2$ |
| Example 8 | 1.47 | 1.59 | 1000 cd/m$^2$ (22 mA/m$^2$) | 4.6 | 210 → 180 cd/m$^2$ |
| Comparative Example 1 | 1.49 | 1.62 | 700 cd/m$^2$ (20 mA/m$^2$) | 3.5 | 150 → 70 cd/m$^2$ |
| Comparative Example 2 | 1.72 | 1.72 | 800 cd/m$^2$ (22 mA/m$^2$) | 3.1 | 170 → 60 cd/m$^2$ |

EXAMPLE 8

In Example 1, as a material constituting the light emitting layer 3, poly(vinyl propionate) (n=1.47, molecular weight: 15,000) was used in place of poly(octafluoropentyl acrylate) (n=1.38, molecular weight: 15,000). A device was produced by the same method as that of Example 1 except for the above. The obtained device was evaluated in the same way as in Example 1. Further, the refractive index of the light emitting layer 3 was evaluated in the same way as in Example 1. Table 1 shows the results.

COMPARATIVE EXAMPLE 1

In Example 1, as a material constituting the light emitting layer 3, poly(methyl methacrylate) (n=1.49, molecular weight: 15,000) was used in place of poly(octafluoropentyl acrylate) (n=1.38, molecular weight: 15,000). A device was produced by the same method as that of Example 1 except for the above. The obtained device was evaluated in the same way

EXAMPLE 9

An organic light emitting device illustrated in FIG. 8 was produced as follows.

First, a transparent conductive support substrate was produced by the same method as that of Example 1, and the hole injecting layer 7 was formed on the transparent conductive support substrate by the same method as that of Example 1.

Next, 0.3 g of a fluorene compound represented by the following formula, 0.03 g of Ir complex represented by the following formula, and 0.5 g of poly(octafluoropentyl acrylate) (n=1.38, molecular weight: 15,000) were dissolved in 50 g of 1,2-dichloropropane to prepare a mixed solution. The mixed solution was applied to the above hole injecting layer 7 by spin coating, and heated at 100° C. for 1 hour, whereby a light emitting layer 3 was formed. At this time, the film thickness of the light emitting layer 3 was set to be 100 nm.

(Fluorene Compound) and (Ir Complex)

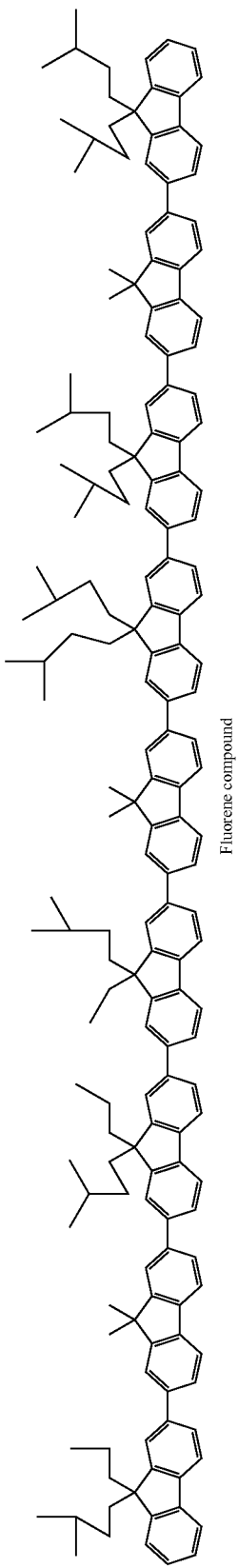
Fluorene compound
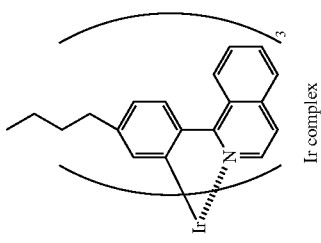
Ir complex

Next, calcium was vapor-deposited on the light emitting layer 3 by vacuum vapor deposition, whereby a metal layer film was formed as an electron injecting layer 8. The film thickness of the electron injecting layer 8 was set to be 1 nm, the vacuum degree during vapor deposition was set to be $1.0 \times 10^{-4}$ Pa, and the film forming rate was set to be 0.1 nm/sec.

Next, aluminum was vapor-deposited by vacuum vapor deposition, whereby a cathode 4 was formed. At this time, the film thickness of the cathode 4 was set to be 150 nm, the vacuum degree during vapor deposition was set to be $1.0 \times 10^{-4}$ Pa, and the film forming rate was set to be 1.0 nm/sec. to 1.2 nm/sec.

Next, a glass plate for protection was placed over the cathode 4 in a nitrogen atmosphere, and sealed with an acrylic resin based adhesive. Thus, an organic light emitting device was obtained.

When a DC voltage of 5 V was applied to the obtained organic light emitting device, with the ITO electrode (anode 2) being a positive electrode and the Al electrode (cathode 4) being a negative electrode, a current flowed through the device. The current density at this time was 20 mA/cm$^2$. Further, in the device, red light emission with a luminance of 2,800 cd/m$^2$ was observed, the chromaticity of the EL light emission was (X, Y)=(0.67, 0.32), and the external quantum efficiency was 15%.

Further, when a voltage was applied for 100 hours while the current density was kept at 5.0 mA/cm$^2$, the luminance changed from 450 cd/m$^2$ (initial luminance) to 340 cd/m$^2$ (after 100 hours). It was found from the result that the degradation in luminance of the organic light emitting device of the present example was small. On the other hand, the refractive index of the light emitting layer 3 was measured to be 1.50 by the same method as that in Example 1. Table 2 shows the results.

EXAMPLE 10

In Example 9, as a material constituting the light emitting layer 3, poly(nonafluoropentyl acrylate) (n=1.36, molecular weight: 12,000) was used in place of poly(octafluoropentyl acrylate) (n=1.38, molecular weight: 15,000). A device was produced by the same method as that of Example 9 except for the above. The obtained device was evaluated in the same way as in Example 9. Further, the refractive index of the light emitting layer 3 was evaluated in the same way as in Example 9. Table 2 shows the results.

EXAMPLE 11

In Example 9, as a material constituting the light emitting layer 3, poly(oxypropylene) (n=1.45, molecular weight: 15,000) was used in place of poly(octafluoropentyl acrylate) (n=1.38, molecular weight: 15,000). A device was produced by the same method as that of Example 9 except for the above. The obtained device was evaluated in the same way as in Example 9. Further, the refractive index of the light emitting layer 3 was evaluated in the same way as in Example 9. Table 2 shows the results.

EXAMPLE 12

In Example 9, as a material constituting the light emitting layer 3, poly(vinyl octyl ether) (n=1.46, molecular weight: 20,000) was used in place of poly(octafluoropentyl acrylate) (n=1.38, molecular weight: 15,000). A device was produced by the same method as that of Example 9 except for the above. The obtained device was evaluated in the same way as in Example 9. Further, the refractive index of the light emitting layer 3 was evaluated in the same way as in Example 9. Table 2 shows the results.

EXAMPLE 13

In Example 9, as a material constituting the light emitting layer 3, poly(vinyl propionate) (n=1.47, molecular weight: 15,000) was used in place of poly(octafluoropentyl acrylate) (n=1.38, molecular weight: 15,000). A device was produced by the same method as that of Example 9 except for the above. The obtained device was evaluated in the same way as in Example 9. Further, the refractive index of the light emitting layer 3 was evaluated in the same way as in Example 9. Table 2 shows the results.

COMPARATIVE EXAMPLE 3

In Example 9, as a material constituting the light emitting layer 3, poly(methyl methacrylate) (n=1.49, molecular weight: 15,000) was used in place of poly(octafluoropentyl acrylate) (n=1.38, molecular weight: 15,000). A device was produced by the same method as that of Example 9 except for the above. The obtained device was evaluated in the same way as in Example 9. Further, the refractive index of the light emitting layer 3 was evaluated in the same way as in Example 9. Table 2 shows the results.

COMPARATIVE EXAMPLE 4

In Example 9, as a material constituting the light emitting layer 3, polycarbonate Z200 (manufactured by MITSUBISHI GAS CHEMICAL COMPANY, INC.) was used in place of poly(octafluoropentyl acrylate) (n=1.38, molecular weight: 15,000). A device was produced by the same method as that of Example 9 except for the above. The obtained device was evaluated in the same way as in Example 9. Further, the refractive index of the light emitting layer 3 was evaluated in the same way as in Example 9. Table 2 shows the results.

TABLE 2

| | Refractive index of polymer | Refractive index of light emitting layer | Initial luminance @5 v application (current density) | External quantum efficiency (%) | Change in luminance (initial luminance → after 100 hours) @5 mA/m$^2$ |
|---|---|---|---|---|---|
| Example 9 | 1.38 | 1.50 | 2800 cd/m$^2$ (20 mA/m$^2$) | 15 | 450 → 340 cd/m$^2$ |
| Example 10 | 1.36 | 1.47 | 3000 cd/m$^2$ (18 mA/m$^2$) | 17 | 520 → 430 cd/m$^2$ |
| Example 11 | 1.45 | 1.55 | 2400 cd/m$^2$ (18 mA/m$^2$) | 13 | 400 → 300 cd/m$^2$ |

TABLE 2-continued

|  | Refractive index of polymer | Refractive index of light emitting layer | Initial luminance @5 v application (current density) | External quantum efficiency (%) | Change in luminance (initial luminance → after 100 hours) @5 mA/m² |
|---|---|---|---|---|---|
| Example 12 | 1.46 | 1.57 | 2500 cd/m² (20 mA/m²) | 12 | 400 → 320 cd/m² |
| Example 13 | 1.47 | 1.57 | 2200 cd/m² (18 mA/m²) | 12 | 380 → 300 cd/m² |
| Comparative Example 3 | 1.49 | 1.61 | 1800 cd/m² (22 mA/m²) | 8 | 350 → 200 cd/m² |
| Comparative Example 4 | 1.72 | 1.72 | 1500 cd/m² (24 mA/m²) | 6 | 270 → 100 cd/m² |

As described above, according to the present invention, an organic light emitting device with a high light extraction efficiency, a high light emitting efficiency, and high durability can be realized. Further, a display apparatus with the above organic light emitting device can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-167194, filed Jun. 26, 2007, which is hereby incorporated by reference herein in its entirety.

What is claimed is:

1. An organic light emitting device comprising:
an anode;
a cathode; and
a light emitting layer formed of an organic compound arranged between the anode and the cathode,
wherein the light emitting layer comprises at least one organic light emitting material and an aliphatic compound not having an aromatic ring, and a refractive index of the light emitting layer is 1.40 or more to 1.60 or less.

2. The organic light emitting device according to claim 1, wherein the organic light emitting material is either one of a fluorescent material and a phosphorescent material.

3. The organic light emitting device according to claim 1, wherein an amount of the organic light emitting material is 2 parts by weight or more to 150 parts by weight or less with respect to 100 parts by weight of the aliphatic compound.

4. A display apparatus comprising the organic light emitting device according to claim 1.

5. The organic light emitting device according to claim 1, wherein the aliphatic compound is at least one selected from the group consisting of poly(undecafluorohexyl acrylate), poly(nonafluoropentyl acrylate), poly(pentafluorovinyl propionate), poly(heptafluorobutyl acrylate), poly(trifluorovinyl acetate), poly(octafluoropentyl acrylate), poly(pentafluoropropyl acrylate), poly(2,2,3,4,4,4-hexafluorobutyl acrylate), poly(trifluoroethyl acrylate), poly(trifluorochloroethylene) and poly(trifluoroethyl methacrylate).

6. The organic light emitting device according to claim 1, wherein the aliphatic compound is at least one selected from the group consisting of poly(oxypropylene), poly(vinyl isobutyl ether), poly(vinyl ethyl ether), poly(oxyethylene), poly(vinyl pentyl ether), poly(vinyl octyl ether), poly(vinyl decyl ether), poly(vinyl dodecyl ether), poly(oxy-1-oxopentamethylene), poly(vinyl propionate) and poly(vinyl methyl ether).

* * * * *